United States Patent [19]
Lucas

[11] Patent Number: 5,289,054
[45] Date of Patent: Feb. 22, 1994

[54] FAST ELECTRONIC COMPARATOR

[75] Inventor: Charles H. Lucas, Fair Oaks, Calif.

[73] Assignee: Intel Corporation, Santa Clara, Calif.

[21] Appl. No.: 856,493

[22] Filed: Mar. 24, 1992

[51] Int. Cl.[5] .................... H03K 5/153; H03K 5/24; H03K 5/08

[52] U.S. Cl. .................................. 307/355; 307/362; 307/491; 307/494; 307/568

[58] Field of Search ............... 307/491, 494, 355, 360, 307/362, 451, 565, 568

[56] References Cited

U.S. PATENT DOCUMENTS

| | | | |
|---|---|---|---|
| 4,209,713 | 6/1980 | Satou et al. | 307/451 |
| 4,223,394 | 9/1980 | Pathak et al. | |
| 4,723,082 | 2/1988 | Asano et al. | 307/451 |
| 4,835,417 | 5/1989 | Kousaka et al. | 307/494 |
| 4,935,649 | 6/1990 | Bloker | 307/451 |
| 5,182,468 | 1/1993 | Erdelyi et al. | 307/568 |

Primary Examiner—John Zazworsky
Attorney, Agent, or Firm—Blakely Sokoloff Taylor & Zafman

[57] ABSTRACT

An MOS comparator circuit for sensing small voltage differences between two inputs is disclosed. The response time of the comparator circuit is improved by providing both a differential amplifier circuit and an output circuit with faster response times. The response time of the differential comparator circuit is improved by preventing the current-mirror from turning off. The response time of the output circuit is improved by limiting the input voltage to the inverter of the output circuit to a range of slightly greater than the balance-point voltage and slightly less than the balance-point voltage of the inverter.

The difference between the response of the comparator circuit to large amplitude input voltages and small amplitude input voltages is also improved.

7 Claims, 5 Drawing Sheets

FAST ELECTRONIC COMPARATOR

BACKGROUND OF THE INVENTION

1. Field of the Invention

The invention relates to the field of MOS integrated comparator circuits and more specifically to CMOS integrated comparator circuits.

2. Prior Art

In the design of complementary metal-oxide semiconductor (CMOS) integrated circuits, comparator circuits are used to detect small differences between the voltages of two input signals. A comparator circuit commonly includes a differential amplifier circuit for receiving two input voltages and generating an output current proportional to the voltage difference between the two inputs, coupled to an output circuit for converting the output current of the differential amplifier circuit to a suitable output voltage signal.

One application for an integrated comparator circuit is the decoding of digital information transmitted at high frequencies over transmission cables. Two rapidly changing voltage signals of varying amplitudes are decoded using a comparator circuit to compare the encoded digital information. For high data transmission frequencies with large amplitude voltage swings, prior art comparator circuits fail to decode the information correctly due to slow comparator response time to large input voltage swings. To allow reliable decoding of digital information transmitted at high frequencies, comparator circuits with faster response times to large input voltage swings are required. The overall response time of a comparator circuit is determined by the individual response times of the differential amplifier circuit and the output circuit.

Prior art differential amplifier circuits commonly include a current source coupled to a differential pair of transistors that are coupled to a current-mirror. Large voltage swings on the inputs to the differential pair of transistors increase the response time of prior art differential amplifier circuits considerably.

Prior art output circuits commonly include an inverter having a balance-point voltage. The balance-point voltage is the input voltage of the inverter that produces a substantially equal voltage at the output of the inverter. As commonly understood, the inverter output switches to a low state when the input voltage increases above the balance-point voltage and to a high state when the input voltage decreases below the balance-point voltage. If the input to the inverter is driven much higher than the balance-point voltage to switch the output to the low state or much lower than the balance-point voltage to switch the output to the high state, then the additional time needed to drive the inverter input below the balance-point voltage or above the balance-point voltage, respectively, in order to subsequently switch the output to the opposite state increases the response time of the inverter and, therefore, output circuit considerably.

The response time of the output circuit can be decreased by limiting the voltage swing at the inverter input. Some MOS read-only memory circuits prevent column lines from fully discharging in order to reduce the time to recharge the column lines as described in U.S. Pat. No. 4,223,394.

It is appreciated then that what is needed is a comparator circuit with a faster response time. Furthermore, the response time of the comparator circuit can be decreased by decreasing the response times of the differential amplifier circuit and the output circuit.

SUMMARY OF THE INVENTION

The present invention provides a semiconductor comparator circuit with an improved response time. The comparator circuit of the present invention comprises both a differential amplifier circuit and an output circuit with improved response times.

The present invention improves the response time of a semiconductor comparator by providing a differential amplifier circuit having a first current source, a differential pair of transistors, a current-mirror with a reference input, and an improvement comprising a means for preventing the current-mirror from turning off when the differential pair of transistors is not conducting current to the reference input of the current-mirror and means for coupling the preventing means to the reference input of the current-mirror.

The present invention further improves the response time of a semiconductor comparator by providing an output circuit having an inverter with a voltage limiting circuit that limits the voltage swing on the input of the inverter to a range of slightly lower than the balance-point voltage of the inverter to slightly higher than the balance-point voltage of the inverter.

DETAILED DESCRIPTION OF THE PREFERRED EMBODIMENT

A CMOS comparator circuit with an improved response time to small and large amplitude input voltages is described. The comparator circuit is useful for comparing signals of varying speed and amplitude because it has high sensitivity and little variation with frequency. In the following description, numerous specific details are put forth, such as conductivity types, transistor dimensions, etc., in order to provide a thorough understanding of the present invention. It will be obvious, however, to one skilled in the art that the present invention may be practiced without these specific details. In other instances, well-known circuits have not been described in detail in order not to unnecessarily obscure the present invention.

Figures 1A, 1B:
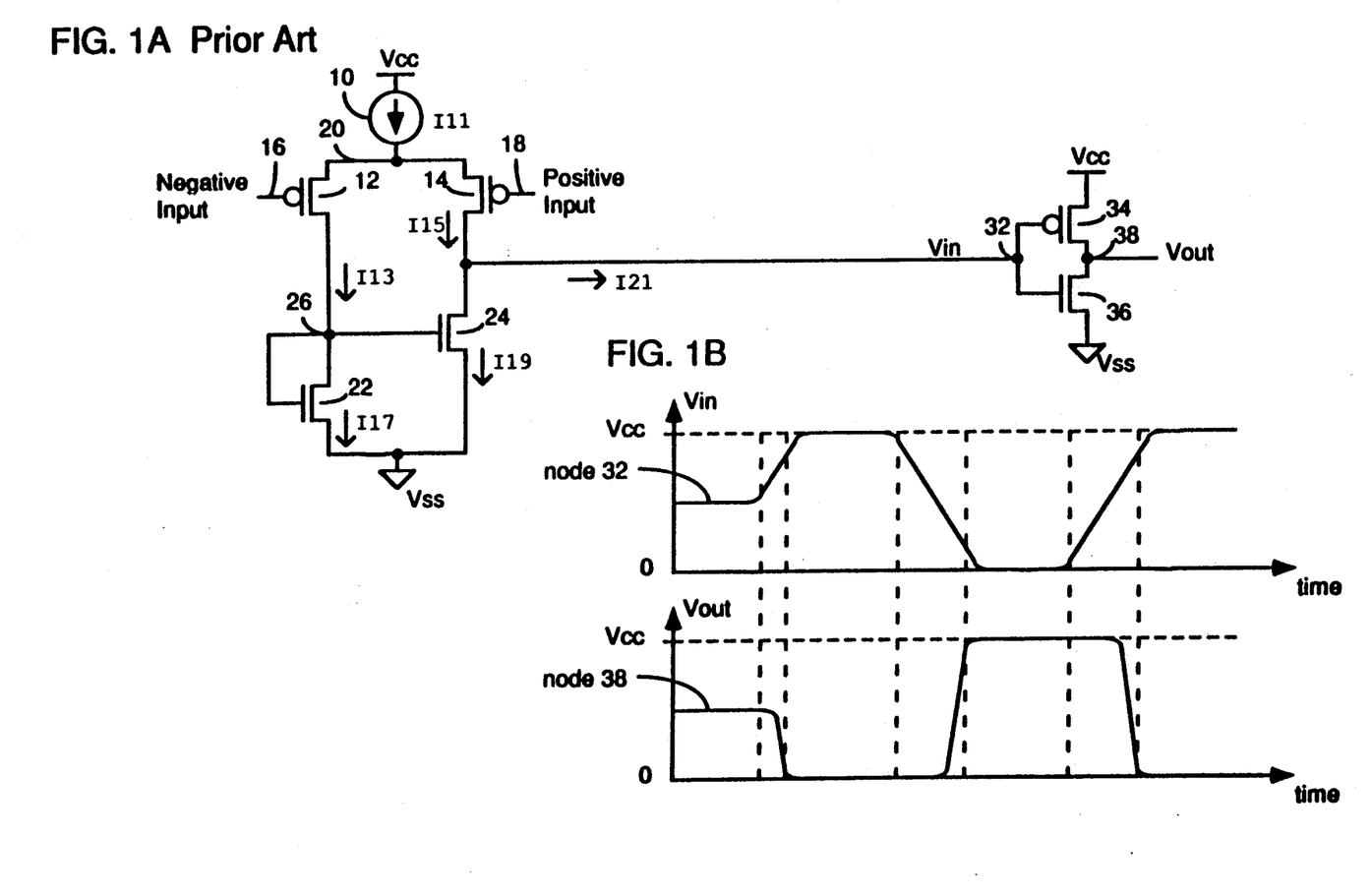
FIG. 1A is an electrical schematic of a typical prior art comparator circuit.
FIG. 1B shows voltage waveforms for the circuit of FIG. 1A illustrating the response time of the output circuit to changes on the inverter input.

Referring to FIG. 1A, a typical prior art integrated comparator circuit including a differential amplifier circuit and an output circuit is shown. The circuitry to the left of current I21 forms the differential amplifier circuit of the prior art comparator. Current source 10 is coupled between positive supply voltage Vcc and node 20 for supplying current I11 to node 20. The sources of P-type transistors 12 and 14 are coupled together at node 20 such that transistors 12 and 14 are a differential pair of transistors. Transistor 12 conducts current I13 proportionally to the negative input 16 voltage coupled to its gate. Transistor 14 conducts current I15 proportionally to the positive input 18 voltage coupled to its gate. N-type transistors 22 and 24 form a current-mirror with a reference input 26. The gate and drain of transistor 22 are coupled together at reference input 26. The gate and drain of transistor 22 are coupled to the gate of transistor 24. The sources of transistors 22 and 24 are coupled to ground Vss. The reference input 26 of the current-mirror is coupled to the drain of transistor 12. The drain of transistor 24 is coupled to the drain of transistor 14 at the output node 32 of the differential amplifier circuit.

In FIG. 1A, the circuitry to the right of current I21 forms the output circuit of the prior art comparator. P-type transistor 34 and N-type transistor 36 form a CMOS inverter. The source of transistor 34 is coupled to Vcc. The gates of transistors 34 and 36 are coupled to node 32. The source of transistor 36 is coupled to ground Vss. The drains of transistors 34 and 36 are coupled together at inverter output node 38.

The response time of prior art differential amplifier circuits increases for large voltage swings on negative input 16. In FIG. 1A for example if the voltage at negative input 16 is such that transistor 12 conducts no current I13 (i.e. I13=0) to the reference input 26 of the current-mirror, the voltage at reference input 26 will collapse to the Vss potential and transistors 22 and 24 will turn off. When the voltage at negative input 16 subsequently changes such that transistor 12 again passes current I13 to reference input 26 of the current-mirror, the time to recharge the voltage at reference input 26 in order to turn the current-mirror back on increases the response time of the differential amplifier circuit considerably. Increases in the response time are especially noted in low power prior art differential amplifier circuits because the current I13 is small and requires a longer time to turn the current-mirror on.

The response time of the prior art output circuit increases when the inverter input at node 32 is overdriven. If the inverter input at node 32 is driven much higher than the balance-point voltage of the inverter to switch output 38 to the low state or much lower than the balance-point voltage of the inverter to switch the output 38 to the high state, then the additional time needed to drive the inverter input 32 below the balance-point voltage or above the balance-point voltage, respectively, in order to subsequently switch the output 38 to the opposite state increases the response time of the output circuit.

Referring to FIG. 1B, waveforms for nodes 32 and 38 of FIG. 1A are shown. Node 32 is the input voltage waveform to the output circuit. Node 38 is the output voltage waveform of the output circuit. The waveforms of node 32 and 38 illustrate the increased response time when the inverter input at node 32 is driven substantially above the balance-point voltage or substantially below the balance-point voltage of the inverter.

In contrast to the circuit of FIG. 1A, the present invention decreases the response time of a semiconductor comparator circuit by improving the response time of both the differential amplifier circuit and the output circuit.

Figures 2A, 2B:
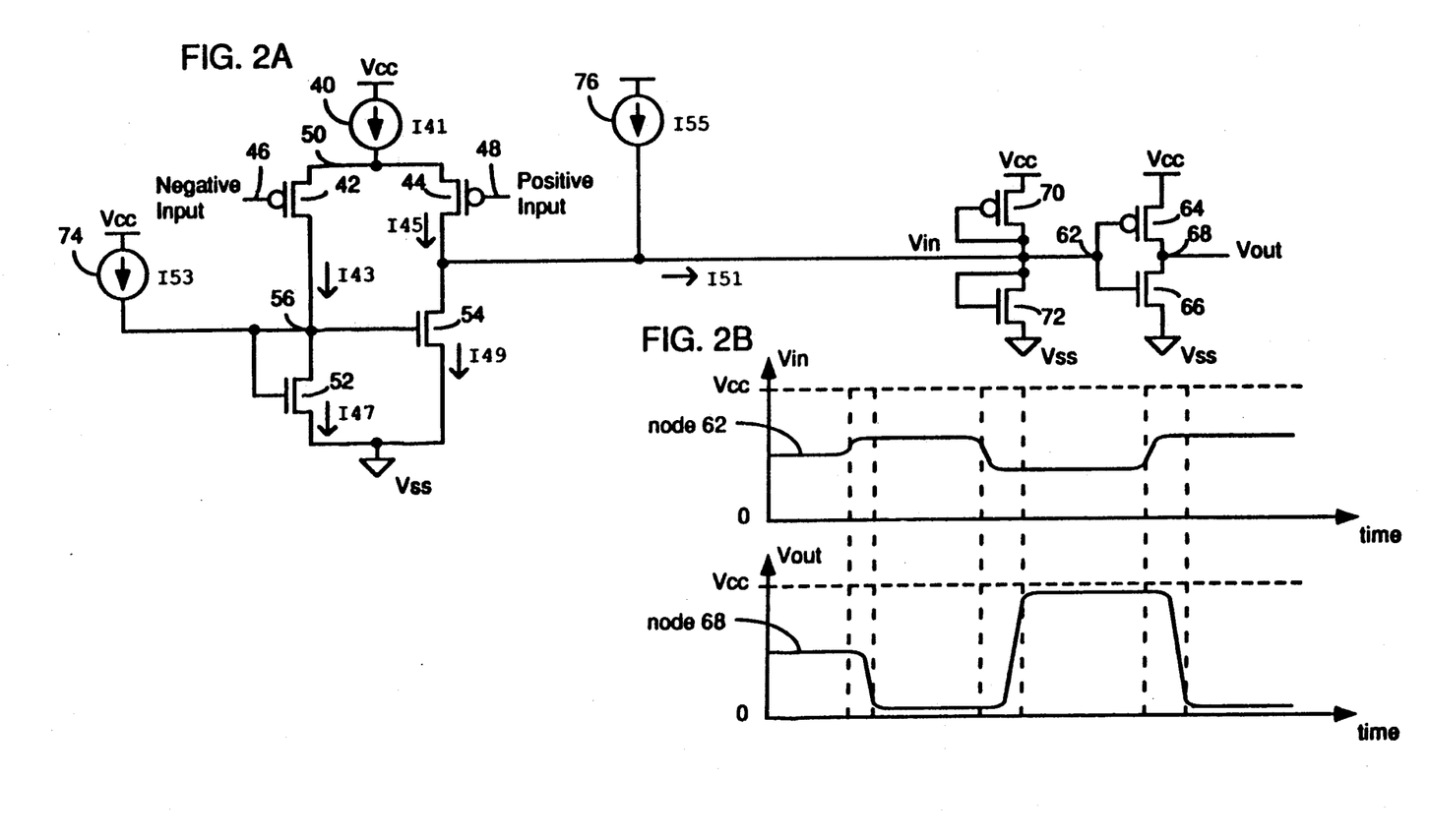
FIG. 2A is an electrical schematic of an embodiment of the comparator circuit of the present invention.
FIG. 2B shows voltage waveforms for the circuit of FIG. 2A illustrating the response time of the improved output circuit to changes on the inverter input.

Referring to FIG. 2A, an embodiment of the present invention is shown. The circuit of the present invention can be realized as an integrated circuit using wellknown complimentary metal-oxide semiconductor (CMOS) processing. Current source 40 is coupled between positive supply voltage Vcc and node 50 for supplying current I41 to node 50. The sources of P-type transistors 42 and 44 are coupled together at node 50 such that transistors 42 and 44 are a differential pair of transistors. Transistor 42 conducts current I43 proportionally to the negative input 46 voltage coupled to its gate. Transistor 44 conducts current I45 proportionally to the positive input 48 voltage coupled to its gate. N-type transistors 52 and 54 form a current-mirror with a reference input 56. The gate and drain of transistor 52 are coupled together at reference input 56. The gate and drain of transistor 52 are coupled to the gate of transistor 54. The sources of transistors 52 and 54 are coupled to ground Vss. The reference input 56 of the currentmirror is coupled to the drain of transistor 42. The drain of transistor 54 is coupled to the drain of transistor 44 at the output node 62 of the differential amplifier circuit. Current source 74 is coupled between Vcc and reference input 56 for providing current I53 to the reference input 56 of the current-mirror. Current source 76 is coupled between Vcc and node 62 for providing current I55 to the differential amplifier circuit output node 62.

P-type transistor 64 and N-type transistor 66 form a CMOS inverter. The source of transistor 64 is coupled to Vcc. The gates of transistors 64 and 66 are coupled to node 62. The source of transistor 66 is coupled to ground Vss. The drains of transistors 64 and 66 are coupled together at node 68.

P-type transistor 70 and N-type transistor 72 are connected as diodes to node 62. The source of transistor 70 is coupled to Vcc. The gate and drain of transistor 70 are coupled together and to node 62. The gate and drain of transistor 72 are coupled together and to node 62. The source of transistor 72 is coupled to Vss.

Describing now the operation of the embodiment of the present invention of FIG. 2A, differential pair of transistors 42 and 44 each conduct a fractional amount of current I41 as currents I43 and I45, respectively, in proportion to their respective negative input 46 and positive input 48 gate voltages.

Transistors 52 and 54 conduct current I47 and I49, respectively, are the same dimensions, and are connected as a current-mirror such that currents I47 and I49 are substantially equal. The additional current I53 injected into reference input 56 by current source 74 prevents transistors 52 and 54 from turning off when current I43 is zero. Preventing transistors 52 and 54 from turning off when transistor 42 conducts no current I43 (i.e. I43=0) decreases the response time of the differential amplifier circuit to large voltages swings on the negative input 46 by about five times. Other circuits such as a resistive path may also be used to prevent transistors 52 and 54 of the current mirror from turning off. The reference node 56 of the current-mirror receives currents I43 and I53 such that I47=I49=I43+I53.

Current source 76 injects current I55 into node 62 such that I51=(I45−I43)+(I55−I53). Currents I55 and I53 are substantially equal and much smaller than currents I43 and I45 such that I51=(I45−I43). Thus, the purpose of current source 76 is to inject a current I55 that is substantially equal to current I53 such that the differential amplifier output current I51 maintains the differential relationship to the negative input 46 and positive input 48 gate voltages on differential pair of transistors 42 and 44, respectively.

The output node 62 of the differential amplifier circuit is also the input node 62 of the output circuit formed by transistors 70, 72, 64, and 66. Transistors 70 and 64, and transistors 72 and 66 are the same size such that the diode-connected transistors 70 and 72 naturally drive node 62 to the balance-point voltage of the inverter formed by transistors 64 and 66. In addition, the diode-connected transistors prevent the voltage at node 62 from moving more than about 300 mV above and 300 mV below the balance-point voltage of the inverter as determined by the voltage-current characteristics of the diode-connected transistors and the magnitude of current I41 supplied by current source 40. The voltage is limited to this range because a forward-biased diode requires large changes in current to affect small changes in the voltage across the diode. The response time of the output circuit is improved by limiting the voltage swing on the input because a smaller voltage change and, therefore, less time are required to switch the state of the inverter. Because the diode-connected transistors naturally establish the balance-point voltage of the inverter at node 62, the response of the circuit is symmetrical, even with processing variations in semiconductor manufacturing and temperature variations.

Therefore, the embodiment of the present invention shown in FIG. 2A improves the response time of MOS comparator circuits by preventing the current-mirror of the differential amplifier circuit from turning off and limiting the input voltage swing of the output circuit. The difference in the response of the comparator circuit of FIG. 2A to large input voltages versus small input voltages is also decreased by preventing the current-mirror from turning off.

Referring to FIG. 2B, waveforms for nodes 62 and 68 of FIG. 2A are shown. Node 62 is the input voltage waveform to the output circuit. Node 68 is the output voltage waveform of the output circuit. Comparing the waveforms of nodes 62 and 68 in FIG. 2B with the waveforms of nodes 32 and 38 in FIG. 1B shows that limiting the swing of the input voltage at node 32 decreases the response time of the output circuit.

Figures 3A, 3B:
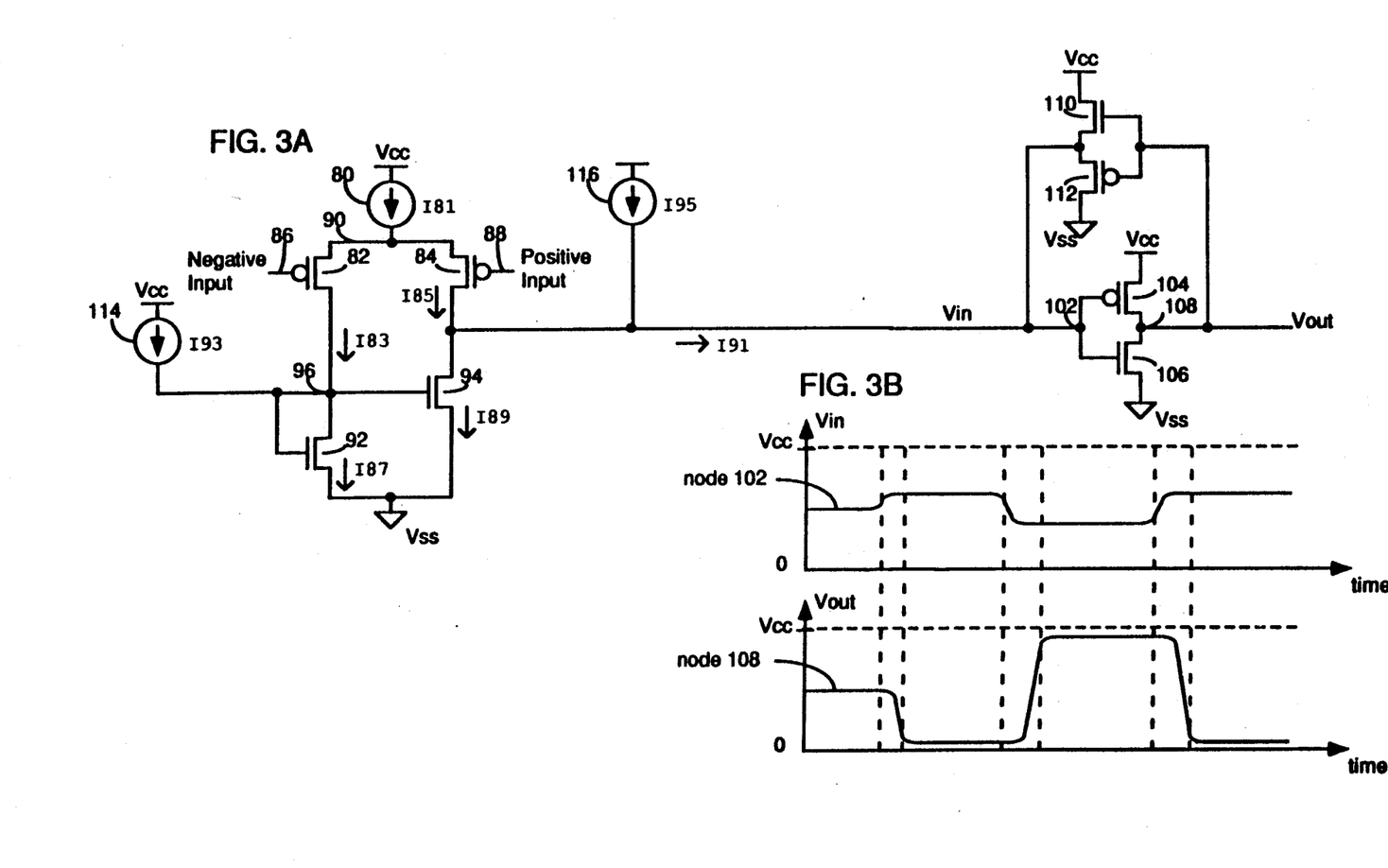
FIG. 3A is an electrical schematic of another embodiment of the comparator circuit of the present invention.
FIG. 3B shows voltage waveforms for the circuit of FIG. 3A illustrating the response time of the improved output circuit to changes on the inverter input.

Referring to FIG. 3A, another embodiment of the present invention is shown. Current source 80 is coupled between positive supply voltage Vcc and node 90 for providing current I81 to node 90. The sources of P-type transistors 82 and 84 are coupled together at node 90 such that transistors 82 and 84 are a differential pair of transistors. Transistor 82 conducts current I83 proportionally to the negative input 86 voltage coupled to its gate. Transistor 84 conducts current I85 proportionally to the positive input 88 voltage coupled to its gate. N-type transistors 92 and 94 form a current-mirror with a reference input 96. The gate and drain of transistor 92 are coupled together at reference input 96. The gate and drain of transistor 92 are coupled to the gate of transistor 94. The sources of transistors 92 and 94 are coupled to ground Vss. The reference input 96 of the current-mirror is coupled to the drain of transistor 82. The drain of transistor 94 is coupled to the drain of transistor 84 at the output node 102 of the differential amplifier circuit. Current source 114 is coupled between Vcc and reference input 96 for providing current I93 to reference input 96. Current source 116 is coupled between Vcc and node 102 for providing current I95 to node 102.

P-type transistor 104 and N-type transistor 106 form a CMOS inverter. The source of transistor 104 is coupled to Vcc. The gates of transistors 104 and 106 are coupled to node 102. The source of transistor 106 is coupled to ground Vss. The drains of transistors 104 and 106 are coupled together at node 108.

N-type transistor 110 and P-type transistor 112 are connected as a negative-feedback source-follower. The drain of transistor 110 is coupled to Vcc. The gate of transistor 110 is coupled to node 108. The source of transistor 110 is coupled to node 102. The drain of transistor 112 is coupled to node Vss. The gate of transistor 112 is coupled to node 108. The source of transistor 112 is coupled to node 102.

Describing now the operation of the embodiment of the present invention of FIG. 3A, differential pair of transistors 82 and 84 each conduct a fractional amount of current I81 as currents I83 and I85, respectively, in proportion to their respective negative input 86 and positive input 88 gate voltages.

Transistors 92 and 94 conduct current I87 and I88, respectively, are same dimensions, and are connected as a current-mirror such that currents I87 and I89 are substantially equal. The additional current I93 injected into reference input 96 by current source 114 prevents transistors 92 and 94 from turning off when current I83 is zero. Preventing transistors 92 and 94 from turning off when transistor 82 conducts no current I83 (i.e. I83=0) decreases the response time of the differential amplifier circuit to large voltages swings on the negative input 86 by about five times. A resistive path to provide current, a current source, and a transistor are some of the methods that may be used to prevent transistors 92 and 94 of the current mirror from turning off. The reference node 96 of the current-mirror receives I83 and I93 such that I87=I89=I83+I93.

Current source 116 injects current I95 into node 102 such that I91=(I85−I83)+(I95−I93). Currents I95 and I93 are substantially equal and much smaller than currents I83 and I85 such that I91=(I85−I83). Thus, the purpose of current source 116 is to inject a current I95 that is substantially equal to current I93 such that the differential amplifier output current I91 maintains the differential relationship to the negative input 86 and positive input 88 gate voltages on differential pair of transistors 82 and 84, respectively.

The output node 102 of the differential amplifier circuit is also the input node 102 of the output circuit formed by transistors 110, 112, 104, and 106. Transistors 110 and 112 form a negative-feedback source-follower from node 108 to node 102. When the voltage at node 102 is approximately the balance-point voltage of the inverter formed by transistors 104 and 106, the inverter will generate a substantially equal voltage at node 108. Because the voltages at node 108 and 102 are substantially equal, both transistors 110 and 112 are turned off. When the differential amplifier circuit drives node 102 above the balance-point voltage of the inverter formed by transistors 104 and 106, the inverter will drive node 108 substantially toward ground Vss causing transistor 112 to turn on strongly and prevent node 102 from increasing more than about 200 mV above the balance-point voltage. When the differential amplifier circuit drives node 102 below the balance-point voltage of the inverter formed by transistors 104 and 106, the inverter will drive node 108 substantially toward ground Vcc causing transistor 110 to turn on strongly and prevent node 102 from decreasing more than about 200 mV below the balance-point voltage.

The negative-feedback voltage source-follower circuit for limiting the voltage swing at the node 102 of the output circuit provides a faster output circuit response time than the diode-clamping circuit of the first embodiment because the negative feedback circuit is not always driving node 102. In the diode-clamping circuit of the first embodiment, the forward-biased diodes are constantly driving the node 102 of the output circuit. However, the negative-feedback circuit of this embodiment does not track process and temperature changes to naturally establish the balance-point voltage of the inverter input as effectively as the diode-clamping circuit of the first embodiment does.

Therefore, the embodiment of the present invention shown in FIG. 3A improves the response time of MOS comparator circuits by preventing the current-mirror of the differential amplifier circuit from turning off and limiting the input voltage swing of the output circuit. The difference in the response of the comparator circuit of FIG. 3A to large input voltages versus small input voltages is also decreased by preventing the current-mirror from turning off.

Referring to FIG. 3B, waveforms for nodes 102 and 108 of FIG. 3A are shown. Node 102 is the input voltage waveform to the output circuit. Node 108 is the output voltage waveform of the output circuit. Comparing the waveforms of nodes 102 and 108 in FIG. 3B with the waveforms of nodes 32 and 38 in FIG. 1B shows that limiting the swing of the input voltage at node 32 decreases the response time of the output circuit.

Figure 4:
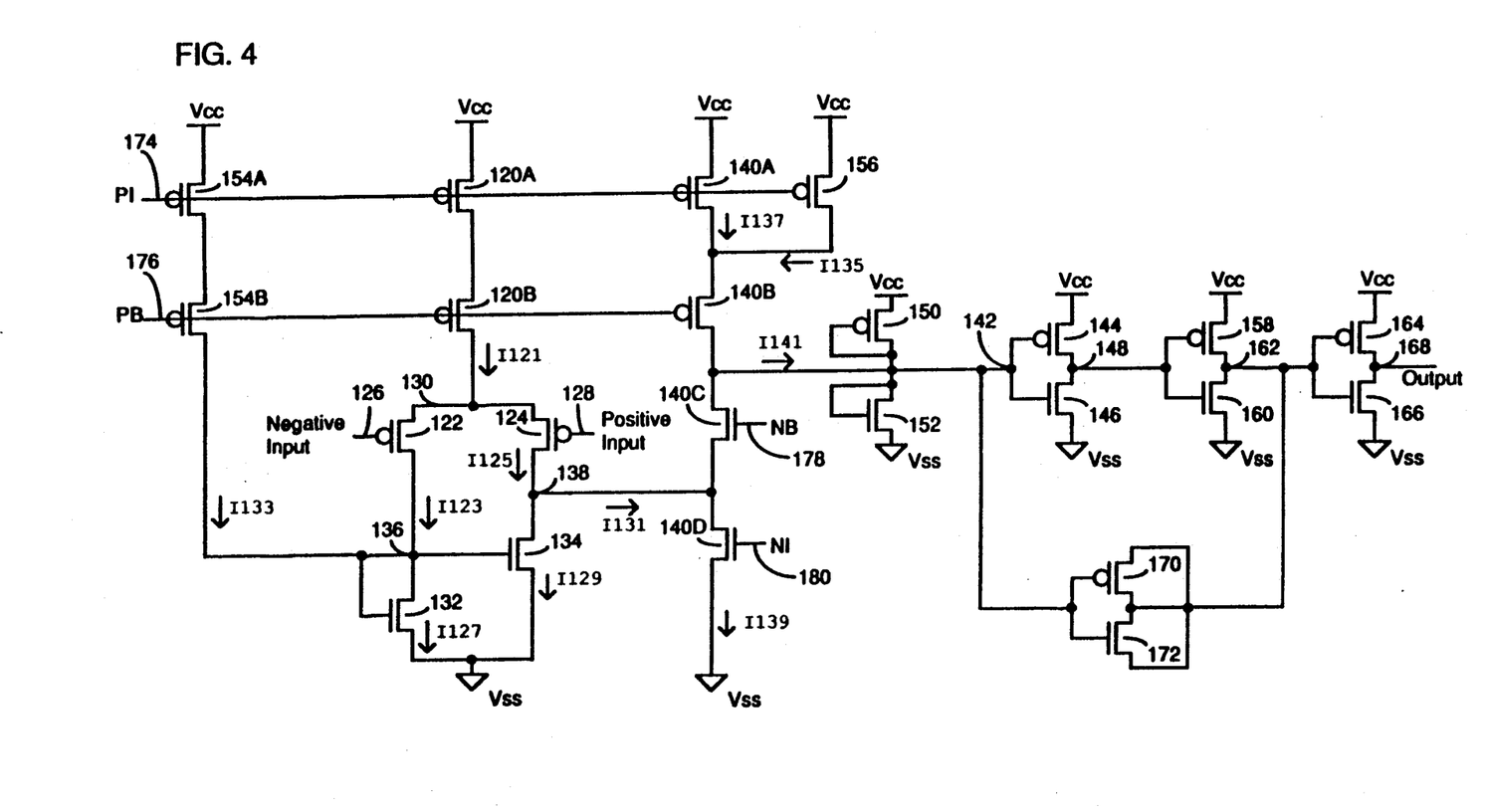
FIG. 4 is an electrical schematic of a first currently preferred embodiment of the semiconductor comparator of the present invention with the current source improvement to the differential amplifier circuit and the diode-connected transistor improvement to the output circuit.

Referring to FIG. 4, a first currently preferred embodiment of the present invention is shown. Vcc is a 5 Volt power supply and Vss is ground. P-type transistors 120A and 120B form a cascode current source for supplying current I121 to node 130 of the differential amplifier circuit. The source of transistor 120A is coupled to Vcc. The gate of transistor 120A is coupled to voltage PI 174 which is about 3.7 volts. The drain of transistor 120A is coupled to the source of transistor 120B. The gate of transistor 120B is coupled to voltage PB 176 which is about 2.5 volts. The drain of transistor 120B is coupled to node 130.

The sources of P-type transistors 122 and 124 are coupled together at node 130 such that transistors 122 and 124 are a differential pair of transistors. Transistors 122 and 124 are the same size. Transistor 122 conducts current I123 proportionally to the negative input 126 voltage coupled to its gate. Transistor 124 conducts current I125 proportionally to the positive input 128 voltage coupled to its gate.

N-type transistors 132 and 134 form a current-mirror with a reference input 136. The gate and drain of transistor 132 are coupled together at reference input 136. The gate and drain of transistor 132 are coupled to the gate of transistor 134. The sources of transistors 132 and 134 are coupled to ground Vss. The reference input 136 of the current-mirror mirror is coupled to the drain of transistor 122. The drain of transistor 134 is coupled to the drain of transistor 124 at the output node 138 of the differential amplifier circuit.

P-type transistors 154A and 154B form a cascode current source for supplying current I133 to the reference input 136 of the current-mirror. The source of transistor 154A is coupled to Vcc. The gate of transistor 154A is coupled to voltage PI 174. The drain of transistor 154A is coupled to the source of transistor 154B. The gate of transistor 154B is coupled to voltage PB 176. The drain of transistor 154B is coupled to node 136.

P-type transistors 140A and 140B and N-type transistors 140C and 140D form a level-shifting buffer that provides voltage gain from output 138 of the differential amplifier circuit to input 142 of the output circuit while also increasing the dynamic range at input 142. The source of transistor 140A is coupled to Vcc. The gate of transistor 140A is coupled to voltage PI 174. The drain of transistor 140A is coupled to the source of transistor 140B. The gate of transistor 140B is coupled to voltage PB 176. The drain of transistor 140B is coupled to node 142 and to the drain of transistor 140C. The gate of transistor 140C is coupled to voltage NB 178 which is about 2.5 volts. The source of transistor 140C is coupled to node 138 and to the drain of transistor 140D. The gate of transistor 140D is coupled to voltage NI which is about 1.3 volts. The source of transistor 140D is coupled to ground Vss.

P-type transistor 144 and N-type transistor 146 forms a CMOS inverter. The source of transistor 144 is coupled to Vcc. The gates of transistors 144 and 146 are coupled to node 142. The source of transistor 146 is coupled to ground Vss. The drains of transistors 144 and 146 are coupled together at node 148.

P-type transistor 156 conducts current I135. The source of transistor 156 is coupled to Vcc. The gate of transistor 156 is coupled to voltage PI 174. The drain of transistor 156 is coupled to the drain of transistor 140A and to the source of transistor 140B.

P-type transistor 150 and N-type transistor 152 are connected as diodes to node 142. The source of transistor 150 is coupled to Vcc. The gate and drain of transistor 150 are coupled together and to node 142. The gate and drain of transistor 152 are coupled together and to node 142. The source of transistor 152 is coupled to Vss.

P-type transistor 158 and N-type transistor 160 form a CMOS inverter. The source of transistor 158 is coupled to Vcc. The gates of transistors 158 and 160 are coupled to node 148. The source of transistor 160 is coupled to ground Vss. The drains of transistors 158 and 160 are coupled together at node 162.

P-type transistor 164 and N-type transistor 166 form a CMOS inverter. The source of transistor 164 is coupled to Vcc. The gates of transistors 164 and 166 are coupled to node 162. The source of transistor 166 is coupled to ground Vss. The drains of transistors 164 and 166 are coupled together at output node 168.

P-type transistor 170 and N-type transistor 172 form a capacitor coupled between node 142 and node 162. The gates of transistors 170 and 172 are coupled to node 142. The drains and sources of transistors 170 and 172 are coupled to node 162.

Describing now the operation of the embodiment of the present invention of FIG. 4, transistors 120A and 120B form a cascode current source for conducting current I121 to the differential pair of transistors 122 and 124. Differential pair of transistors 122 and 124 each conduct a fractional amount of current I121 as currents I123 and I125, respectively, in proportion to their respective negative input 126 and positive input 128 gate voltages.

Transistors 132 and 134 conduct currents I127 and I129, respectively, are same dimensions, and are connected as a current-mirror such that currents I127 and I129 are substantially equal. Transistors 154A and 154B form a cascode current source for generating current I133. Current I133 is injected into reference input 136 to prevent the current-mirror from turning off when current I123 is zero. Preventing the current-mirror from turning off when transistor 122 conducts no current I123 (i.e. I123=0) decreases the response time of the differential amplifier circuit to large voltages swings on the negative input 126 by about five times. A resistive path to provide current or a current source are some of the methods that may be used to prevent transistors 132 and 134 of the current mirror from turning off. The reference node 136 of the current-mirror receives currents I123 and I133 such that I127=I129=I123+I133.

Transistors 140A and 140B form a cascode current source that generates current I137. Transistors 140C and 140D form a folded-cascode current source that generates current I139 which is substantially equal to current I137 such that currents I138 and I141 are substantially independent of currents I137 and I139. Transistors 140C and 140D provide voltage level shifting between nodes 138 and 142 while also increasing the dynamic range of node 142. In addition, transistors 140C and 140D are coupled to node 138 as a folded cascode such that substantial voltage gain is provided to buffer node 138 and node 142. The folded cascode buffers the differential amplifier circuit output node 138 from the node 142 such that currents I131 and I141 are substantially equal.

Current source 156 injects current I135 into node 142 such that I141=(I125−I123)+(I135−I133). Currents I135 and I133 are substantially equal and much smaller than currents I123 and I125 such that I141=(I125−I123). Thus, the purpose of current source 156 is to inject a current I135 that is substantially equal to current I133 such that the differential amplifier output current I131 maintains the differential relationship to the negative input 126 and positive input 128 gate voltages on differential pair of transistors 122 and 124, respectively.

The output circuit is formed by transistors 144, 146, 150, and 152. Transistors 150 and 144, and transistors 152 and 146 are the same size such that the diode-connected transistors 150 and 152 naturally drive node 142 to the balance-point voltage of the inverter formed by transistors 144 and 146. In addition, the diode-connected transistors prevent the voltage at node 142 from moving more than about 300 mV above and 300 mV below the balance-point voltage of the inverter as determined by the voltage-current characteristics of the diode-connected transistors and the magnitude of current I121. The voltage is limited to this range because a forward-biased diode requires large changes in current to affect small changes in the voltage across the diode. The voltage at the output 148 of the inverter formed by transistors 144 and 146 swings to about 4 volts when the inverter input node 142 is 300 mV above the balance-point voltage and to about 1 volt when the inverter input node 142 is 300 mV below the balance-point voltage.

The response time of the output circuit formed by transistors 144, 146, 150, and 152 is improved by limiting the voltage swing on the input because a smaller voltage change and, therefore, less time are required to switch the state of the inverter. Because the diode-connected transistors 150 and 152 naturally establish at node 142 the balance-point voltage of the inverter formed by transistors 144 and 146, the response of the circuit is symmetrical, even with extreme process or temperature variations.

A 4 volts to 1 volt swing on node 148 causes the output node 162 of the inverter formed by transistors 158 and 160 to swing from 0 volts to 5 volts, respectively. The 0 volts to 5 volts voltage swing on node 162 causes the output node 168 of the inverter formed by transistors 164 and 166 to swing from 5 volts to 0 volts, respectively.

Transistors 170 and 172 form a capacitor between nodes 142 and 162. This capacitive coupling between nodes 142 and 162 provides regeneration and ac hysteresis. The regeneration snaps node 162 to Vcc or ground as the voltage at node 142 crosses below the balance-point voltage or above the balance-point voltage, respectively. The hysteresis prevents noise at node 162 from affecting node 142.

Therefore, the first currently preferred embodiment of the present invention shown in FIG. 4 improves the response time of MOS comparator circuits by preventing the current-mirror of the differential amplifier circuit from turning off and limiting the input voltage swing of the output circuit. The difference in the response of the comparator circuit of FIG. 4 to large input voltages versus small input voltages is also decreased by preventing the current-mirror from turning off.

Figure 5:
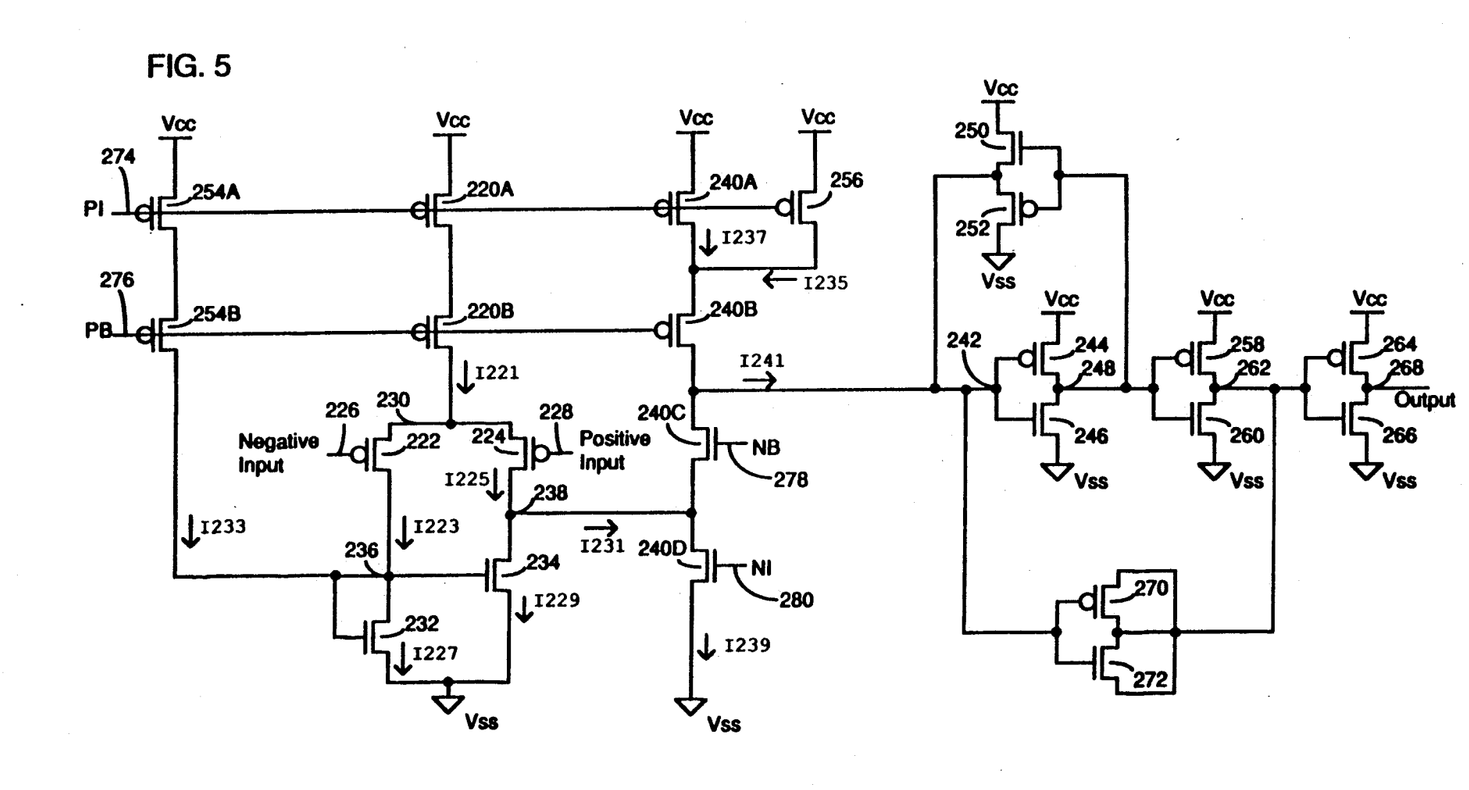
FIG. 5 is an electrical schematic of a second currently preferred embodiment of the semiconductor comparator of the present invention with the current source improvement to the differential amplifier circuit and the negative feedback improvement to the output circuit.

Referring to FIG. 5, a second currently preferred embodiment of the present invention is shown. Vcc is a 5 Volt power supply and Vss is ground. P-type transistors 220A and 220B form a cascode current source for supplying current I221 to the differential amplifier circuit. The source of transistor 220A is coupled to Vcc. The gate of transistor 220A is coupled to voltage PI 274 which is about 3.7 volts. The drain of transistor 220A is coupled to the source of transistor 220B. The gate of transistor 220B is coupled to voltage PB 276 which is about 2.5 volts. The drain of transistor 220B is coupled to node 230.

The sources of P-type transistors 222 and 224 are coupled together at node 230 such that transistors 222 and 224 are a differential pair of transistors. Transistors 222 and 224 are the same size. Transistor 222 conducts current I223 proportionally to the negative input 226 voltage coupled to its gate. Transistor 224 conducts current I225 proportionally to the positive input 228 voltage coupled to its gate.

N-type transistors 232 and 234 form a current-mirror with a reference input 236. The gate and drain of transistor 232 are coupled together at reference input 236. The gate and drain of transistor 232 are coupled to the gate of transistor 234. The sources of transistors 232 and 234 are coupled to ground Vss. The reference input 236 of the current-mirror is coupled to the drain of transistor 222. The drain of transistor 234 is coupled to the drain of transistor 224 at the output node 238 of the differential amplifier circuit.

P-type transistors 254A and 254B form a cascode current source for supplying current I233 to the reference input 236 of the current-mirror. The source of transistor 254A is coupled to Vcc. The gate of transistor 254A is coupled to voltage PI 274. The drain of transistor 254A is coupled to the source of transistor 254B. The gate of transistor 254B is coupled to voltage PB 276. The drain of transistor 254B is coupled to node 236.

P-type transistors 240A and 240B and N-type transistors 240C and 240D act as a bias circuit for the inverter formed by transistors 244 and 246 and a folded cascode to buffer the output 238 of the differential amplifier circuit. The source of transistor 240A is coupled to Vcc. The gate of transistor 240A is coupled to voltage PI 274. The drain of transistor 240A is coupled to the source of transistor 240B. The gate of transistor 240B is coupled to voltage PB 276. The drain of transistor 240B is coupled to node 242 and to the drain of transistor 240C. The gate of transistor 240C is coupled to voltage NB 278 which is about 2.5 volts. The source of transistor 240C is coupled to node 238 and to the drain of transistor 240D. The gate of transistor 240D is coupled to voltage NI which is about 1.3 volts. The source of transistor 240D is coupled to ground Vss.

P-type transistor 244 and N-type transistor 246 form a CMOS inverter. The source of transistor 244 is coupled to Vcc. The gates of transistors 244 and 246 are coupled to node 242. The source of transistor 246 is coupled to ground Vss. The drains of transistors 244 and 246 are coupled together at node 248.

P-type transistor 256 generates current I235. The source of transistor 256 is coupled to Vcc. The gate of transistor 256 is coupled to voltage PI 274. The drain of transistor 256 is coupled to the drain of transistor 240A and to the source of transistor 240B.

N-type transistor 250 and P-type transistor 252 are connected as a negative-feedback source-follower between nodes 248 and 242. The drain of transistor 250 is coupled to Vcc. The gate of transistor 250 is coupled to node 248. The source of transistor 250 is coupled to node 242. The drain of transistor 252 is coupled to Vss. The gate of transistor 252 is coupled to node 248. The source of transistor 252 is coupled to node 242.

P-type transistor 258 and N-type transistor 260 form a CMOS inverter. The source of transistor 258 is coupled to Vcc. The gates of transistors 258 and 260 are coupled to node 248. The source of transistor 260 is coupled to ground Vss. The drains of transistors 258 and 260 are coupled together at node 262.

P-type transistor 264 and N-type transistor 266 form a CMOS inverter. The source of transistor 264 is coupled to Vcc. The gates of transistors 264 and 266 are coupled to node 262. The source of transistor 266 is coupled to ground Vss. The drains of transistors 264 and 266 are coupled together at output node 268.

P-type transistor 270 and N-type transistor 272 form a capacitor coupled between node 242 and node 262. The gates of transistors 270 and 272 are coupled to node 242. The drains and sources of transistors 270 and 272 are coupled to node 262.

Describing now the operation of the embodiment of the present invention of FIG. 5, transistors 220A and 220B form a cascode current source for generating current I221. Differential pair of transistors 222 and 224 each conduct a fractional amount of current I221 as currents I223 and I225, respectively, in proportion to their respective negative input 226 and positive input 228 gate voltages.

Transistors 232 and 234 conduct currents I227 and I229, respectively, are the same dimensions, and are connected as a current-mirror such that currents I227 and I229 are substantially equal. Transistors 254A and 254B form a cascode current source for generating current I233. Current I233 is injected into reference input 236 to prevent the current-mirror from turning off when current I223 is zero. Preventing the current-mirror from turning off when transistor 222 conducts no current I223 (i.e. I223=0) decreases the response time of the differential amplifier to large voltages swings on the negative input 226 by about five times. A resistive path to provide current or current source are some of the methods that may be used to prevent transistors 232 and 234 of the current mirror from turning off. The reference node 236 of the current-mirror receives currents I223 and I233 such that I227=I229=I223+I233.

Transistors 240A and 240B form a cascode current source that generates current I237. Transistors 240C and 240D form a folded-cascode current source that generates current I239 which is substantially equal to current I237 such that currents I238 and I241 are substantially independent of current I237 and I239. Transistors 240C and 240D provide voltage level shifting between nodes 238 and 242 while also increasing the dynamic range of node 242. In addition, transistors 240C and 240D are coupled to node 238 as a folded cascode such that substantial voltage gain is provided to buffer node 238 and node 242. The folded cascode buffers the differential amplifier circuit output node 238 from the output node 242 such that currents I231 and I241 are substantially equal.

Transistor 256 injects current I235 into node 242 such that I241=(I225−I223)+(I235−I233). Currents I235 and I233 are substantially equal and much smaller than currents I223 and I225 such that I241=(I225−I223). Thus, the purpose of current source 256 is to inject a current I235 that is substantially equal to current I233 such that the differential amplifier circuit output current I231 maintains the differential relationship to the negative input 226 and positive input 228 gate voltages on differential pair of transistors 222 and 224, respectively.

The output circuit is formed by transistors 244, 246, 250, and 252. Transistors 250 and 252 form a negative-feedback source-follower between nodes 248 and 242. When the differential amplifier circuit is not driving node 242, transistors 140A, 140B, 140C, and 140D establish approximately the balance-point voltage of the inverter formed by transistors 244 and 246 at input node 242 causing the inverter to generate a substantially equal voltage at node 248. Because the voltages at node 248 and 242 are substantially equal when the differential amplifier circuit is not causing node 242 to be driven, both transistors 250 and 252 are turned off. When node 242 is driven above the balance-point voltage of the inverter formed by transistors 244 and 246, the inverter will drive node 248 substantially toward ground Vss causing transistor 252 to turn on strongly and prevent node 242 from increasing more than about 200 mV above the balance-point voltage. When node 242 is driven below the balance-point voltage of the inverter formed by transistors 244 and 246, the inverter will drive node 248 substantially toward Vcc causing transistor 250 to turn on strongly and prevent node 242 from decreasing more than about 200 mV below the balance-point voltage. The voltage at the output node 248 of the inverter formed by transistors 244 and 246 swings to about 4 volts when the inverter input node 242 is 200 mV above the balance-point voltage and to about 1 Volt when the inverter input node 242 is 200 mV below the balance-point voltage.

The negative-feedback source-follower circuit for limiting the voltage swing at the input node 242 of the output circuit provides a faster output circuit and overall comparator response time than the diode-clamping circuit of the first preferred embodiment because the differential amplifier circuit can change the voltage at node 242 more rapidly when node 242 is not otherwise being driven. The negative-feedback source follower circuit only drives node 242 when the differential amplifier is driving the voltage at node 242 away from the balance-point voltage. In the diode-clamping circuit of the first embodiment, the forward-biased diodes are constantly driving the input node of the output circuit. However, the negative-feedback circuit of this embodiment doesn't track process and temperature changes to naturally establish the balance-point voltage of the inverter at the inverter input as well as the diode-clamping circuit of the first preferred embodiment does.

A 4 volts to 1 volt swing on node 248 causes the output node 262 of the inverter formed by transistors 258 and 260 to swing from 0 volts to 5 volts, respectively. The 0 volts to 5 volts voltage swing on node 262 causes the output node 268 of the inverter formed by transistors 264 and 266 to swing from 5 volts to 0 volts, respectively.

Transistors 270 and 272 form a capacitor between nodes 242 and 262. This capacitive coupling between nodes 242 and 262 provides regeneration and ac hysteresis. The regeneration snaps node 262 to Vcc or ground as the voltage at node 242 crosses below the balance-point voltage or above the balance-point voltage, respectively. The hysteresis prevents prevents noise at node 262 from affecting node 242.

Therefore, the second currently preferred embodiment of the present invention shown in FIG. 5 improves the response time of MOS comparator circuits by preventing the current-mirror of the differential amplifier circuit from turning off and limiting the input voltage swing of the output circuit. The difference in the response of the comparator circuit of FIG. 5 to large input voltages versus small input voltages is also decreased by preventing the current-mirror from turning off.

Thus, a semiconductor comparator circuit including a differential amplifier circuit and an output circuit with improved response times has been described.

What is claimed is:

1. A semiconductor circuit comprising:
   inverter with an input and an output, said inverter being responsive to the voltage at said input of said inverter such that when said voltage at said input of said inverter is greater than a balance-point voltage the output of said inverter switches to a first state, said inverter being responsive to said voltage at said input of said inverter such that when said voltage at said input of said inverter is less than said balance-point voltage said output of said inverter switches to a second state;
   first transistor of a first conductivity type, the gate of said first transistor being coupled to the drain of said first transistor, the drain of said first transistor being coupled to said input of said inverter, the source of said first transistor being coupled to the power supply voltage;
   second transistor of a second conductivity type, the gate of said second transistor being coupled to the drain of said second transistor, the drain of said second transistor being coupled to said input of said inverter, the source of said second transistor being coupled to ground; and
   said first transistor and said second transistor being the same sizes as the transistors of the same conductivity type in said inverter such that said balance-point voltage of said inverter is established at the input of said inverter.

2. The circuit of claim 1 wherein said first conductivity type is P-type and said second conductivity type is N-type.

3. In a semiconductor circuit having an inverter with an input and an output, said inverter being responsive to the voltage at said input of said inverter such that when said voltage at said input of said inverter is greater than a balance-point voltage the output of said inverter switches to a first state, said inverter being responsive to said voltage at said input of said inverter such that when said voltage at said input of said inverter is less than said balance-point voltage said output of said inverter switches to a second state, the improvement comprising:
   negative feedback circuit for receiving said output of said inverter and generating a negative feedback signal coupled to said input of said inverter, said negative feedback signal preventing said voltage at said input of said inverter from increasing above a first predetermined voltage above said balance-point voltage when said output of said inverter is in said first state, said feedback signal preventing said voltage at said input of said inverter from decreasing below a second predetermined voltage below said balance-point voltage when said output of said inverter is in said second state wherein said first predetermined voltage is less than a positive power supply voltage wherein said second predetermined voltage is greater than ground potential.

4. In a semiconductor circuit having an inverter with an input and an output, said inverter being responsive to the voltage at said input of said inverter such that when said voltage at said input of said inverter is greater than a balance-point voltage the output of said inverter switches to a first state, said inverter being responsive to said voltage at said input of said inverter such that when said voltage at said input of said inverter is less than said balance-point voltage said output of said inverter switches to a second state, the improvement comprising:
   first transistor of a first conductivity type, the gate of said first transistor being coupled to said output of said inverter, the source of said first transistor being coupled to said input of said inverter, the drain of said first transistor being coupled to the power supply voltage;
   second transistor of a second conductivity type, the gate of said second transistor being coupled to said output of said inverter, the gate of said second transistor being coupled to said gate of said first transistor, the source of said second transistor being coupled to said input of said inverter, the drain of said second transistor being coupled to ground.

5. The circuit of claim 4 wherein said first conductivity type is P-type and said second conductivity type is N-type.

6. An integrated circuit for comparing a first input signal to a second input signal and generating an output signal corresponding to the voltage difference between said first input signal and said second input signal comprising:

first current source means for generating a first current;

differential pair means for receiving said first input signal, said second input signal, and said first current and generating a second current at a second output node and a third current at a third output node, said second current and said third current each being proportional to the voltage difference between said first input signal and said second input signal;

second current source means for generating a fourth current;

current-mirror means for receiving said second current and said fourth current and generating a fifth current, said fifth current being substantially equal to the sum of said second current and said fourth current, said current-mirror being coupled to said third output node such that said fifth current is directed away from said third output node, said fourth current preventing said current-mirror from turning off when said second current is zero;

fourth current source means for generating a sixth current;

fifth current source means for generating a seventh current;

folded-cascode means for receiving said sixth current and said seventh current at a folded-cascode input and generating an eighth current at a folded-cascode output, said folded-cascode means also having a bidirectional input for allowing current to flow between said folded-cascode input and said bidirectional input, said bidirectional input being coupled to said third output node, said eighth current being substantially equal to said sixth current and said seventh current being substantially equal to said fourth current such that the current flowing between said folded-cascode input and said bidirectional input is substantially determined by the difference between said second current and said third current, said folded-cascode providing impedance buffering from said bidirectional input to said folded-cascode input, said folded-cascode input being at a balance-point voltage when said first input signal and said second input signal are substantially equal;

first inverter means for receiving said folded-cascode input and generating a first voltage, said folded-cascode input being coupled to the input of said first inverter means;

voltage clamping means coupled to said input of said first inverter means for substantially clamping said voltage at said input to said inverter at said balance-point voltage, said voltage clamping means allowing said voltage at said input of said inverter to only slightly increase above said balance-point voltage, said clamping means allowing said voltage at said input of said inverter to only slightly decrease below said balance-point voltage;

capacitor means coupled to said folded-cascode input and said second voltage for capacitively coupling said folded-cascode input and said second voltage; and third inverter means for receiving said second voltage and generating said output signal.

7. An integrated circuit for comparing a first input signal to a second input signal and generating an output signal corresponding to the voltage difference between said first input signal and said second input signal comprising:

first current source means for generating a first current;

differential pair means for receiving said first input signal, said second input signal, and said first current and generating a second current at a second output node and a third current at a third output node, said second current and said third current each being proportional to the voltage difference between said first input signal and said second input signal;

second current source means for generating a fourth current;

current-mirror means for receiving said second current and said fourth current and generating a fifth current, said fifth current being substantially equal to the sum of said second current and said fourth current, said current-mirror being coupled to said third output node such that said fifth current is directed away from said third output node, said fourth current preventing said current-mirror from turning off when said second current is zero;

fourth current source means for generating a sixth current;

fifth current source means for generating a seventh current;

folded-cascode means for receiving said sixth current and said seventh current at a folded-cascode input and generating an eighth current at a folded-cascode output, said folded-cascode means also having a bidirectional input for allowing current to flow between said folded-cascode input and said bidirectional input, said bidirectional input being coupled to said third output node, said eighth current being substantially equal to said sixth current and said seventh current being substantially equal to said fourth current such that the current flowing between said folded-cascode input and said bidirectional input is substantially determined by the difference between said second current and said third current, said folded-cascode providing impedance buffering from said bidirectional input to said folded-cascode input, said folded-cascode input being at a balance-point voltage when said first input signal and said second input signal are substantially equal;

first inverter for receiving said folded-cascode input and generating a first voltage;

negative feedback circuit for receiving said first voltage and generating a negative feedback signal coupled to said input of said inverter, said negative feedback signal allowing said voltage at said input of said inverter to only slightly increase above said balance-point voltage when said output of said inverter is in a first state, said feedback signal allowing said voltage at said input of said inverter to only slightly decrease below said balance-point voltage when said output of said inverter is in a second state;

capacitor means coupled to said folded-cascode input and said second voltage for capacitively coupling said folded-cascode input and said second voltage; and third inverter means for receiving said second voltage and generating said output signal.

* * * * *

UNITED STATES PATENT AND TRADEMARK OFFICE
CERTIFICATE OF CORRECTION

PATENT NO. : 5,289,054
DATED : February 22, 1994
INVENTOR(S) : Charles H. Lucas

It is certified that error appears in the above-indentified patent and that said Letters Patent is hereby corrected as shown below:

Column 7, line 23, insert --at the inverter-- following "inverter".

Signed and Sealed this

Twenty-sixth Day of September, 1995

Attest:

BRUCE LEHMAN

*Attesting Officer*  *Commissioner of Patents and Trademarks*